United States Patent [19]

Böhme

[11] Patent Number: 5,541,550
[45] Date of Patent: Jul. 30, 1996

[54] ELECTRONIC LOAD RESISTOR CIRCUIT

[75] Inventor: Rolf Böhme, Friedrichshall, Germany

[73] Assignee: Temic Telefunken microelectronic GmbH, Heilbronn, Germany

[21] Appl. No.: 235,675

[22] Filed: Apr. 29, 1994

[30] Foreign Application Priority Data

Jun. 17, 1993 [DE] Germany .................... 43 20 006.0

[51] Int. Cl.$^6$ .................................................. G05F 1/10
[52] U.S. Cl. .................. 327/520; 327/519; 327/563; 327/109; 330/252
[58] Field of Search ............................ 327/563, 562, 327/561, 560, 109, 519, 520, 432, 334, 362, 518, 519, 520, 109, 563; 330/252, 257

[56] References Cited

U.S. PATENT DOCUMENTS

| | | | |
|---|---|---|---|
| 3,446,987 | 5/1969 | Ito | 307/200 |
| 3,573,491 | 4/1971 | Goss | 327/563 |
| 4,179,650 | 12/1979 | Fukushima et al. | 323/1 |
| 4,520,282 | 5/1985 | Watanabe et al. | 327/538 |
| 4,555,670 | 11/1985 | Tanaka | 330/252 |
| 4,605,906 | 8/1986 | Miller | 330/252 |
| 4,724,339 | 2/1988 | Ishida | 330/252 |
| 5,119,041 | 6/1992 | Hanna | 330/252 |
| 5,124,580 | 6/1992 | Matthews et al. | 327/538 |
| 5,134,309 | 7/1992 | Matsumoto et al. | 327/563 |

FOREIGN PATENT DOCUMENTS

| | | | |
|---|---|---|---|
| 0296131 | 12/1988 | European Pat. Off. | |
| 2277461 | 1/1976 | France | H03F 3/45 |
| 4210215A1 | 12/1992 | Germany | H03F 3/45 |

OTHER PUBLICATIONS

Randall L. Geiger et al.: "VLSI Design Techniques for Analog and Digital Circuits". McGraw–Hill Book Co.–Singapore 1990, p. 327.

*Primary Examiner*—Timothy P. Callahan
*Assistant Examiner*—Terry L. Englund
*Attorney, Agent, or Firm*—Spencer & Frank

[57] ABSTRACT

Conventional integrable differential amplifiers have implanted resistors as load resistors, the limited size of which represents a barrier for the minimization of current consumption. In accordance with the present invention, the load resistors are replaced by load elements that represent non-linear two-terminal elements such as diodes, the potential at these load elements is held constant via a control loop by a controlling element such as a control transistor. This allows the current consumption of differential amplifier stages to be reduced to the order of magnitude of the residual current without increasing the area required for integration of the circuit.

18 Claims, 4 Drawing Sheets

ELECTRONIC LOAD RESISTOR CIRCUIT

BACKGROUND OF THE INVENTION

The invention relates to electronic load resistors, supplied from at least one signal source, for low-power bipolar circuits and for control amplifiers and the use of these for balancing unsymmetrical signals. In amplifier circuits, load resistors are normally used for converting current to voltage by means of an amplifier element, e.g. a bipolar transistor, supplying an output current that causes a voltage drop across a load resistor that can then be used as input voltage for another amplifier stage. A differential stage supplies two output currents and normally requires two load resistors. There are also arrangements with more than two output currents. Also for the balancing of signals that are not balanced to earth, resistors embedded in an auxiliary circuit are usually used. If the objective of low current consumption is pursued here, large load resistors result in bipolar integrated circuits that take up a disproportionately large amount of space and, owing to their junction capacitance, they have an adverse effect on the frequency response. The increased space required also leads to correspondingly higher costs for the manufacture of the integrated circuit. For this reason, it has been proposed (EP 0296131) in conjunction with active filters to use a series circuit of diodes in place of a resistor. It is also possible to increase the size of a resistor electronically by 'bootstrapping' (VLSI design techniques for analog and digital circuits, McGraw-Hill Book Co.—Singapore 1990, page 327).

In a series circuit of diodes, a considerable voltage is required, however, which is very undesirable in terms of total power and controllabillty. Increasing the size of a resistance by bootstrapping is not very stable and requires additional coupling capacitors, representing a conflict with regard to the desired saving in surface area.

SUMMARY OF THE INVENTION

The object of the invention is to provide a circuit having electronic load resistors that can be used in place of passive resistors, that have a lower current consumption, whose space requirements in an integrated circuit is low, and that are not subjected to greater junction capacitances.

In order to achieve this object, the ohmic load resistors of the circuit are replaced by load elements each of which represents a non-linear two-terminal element. Accordingly, the controlled current sources with the load elements and the controlling element or controlling elements form a control loop for keeping constant the potential at the load elements. By using such load elements, the current consumption of differential stages can be reduced down to the order of magnitude of the residual currents without the need for a greater surface area. The additional current consumption for the electronic load resistors is simply 1/V times the current consumption of a supplying differential stage, where V is the gain of the differential stage.

Semiconductor diodes or transistors connected as diodes can advantageously be used as load elements. The substrate capacitance of such transistor diodes is small compared with the large implanted resistors so that the effective frequency range increases. The non-linearity of the transistor diodes corresponds entirely to the non-linearity of a following differential amplifier stage, and the current-to-voltage conversion at the transistor diodes and the following voltage-to-current conversion in a differential amplifier stage provides an essentially distortion-free amplification. A further advantage is that semiconductor diodes have predominantly shot noise at low current, while resistors have thermal noise. The noise power of diodes with a differential resistance Rx is only half as great as the noise power of an ohmic resistor of magnitude Rx so that also from this aspect there is no worsening of the characteristics.

BRIEF DESCRIPTION OF THE DRAWINGS

The invention will be described and explained below on the basis of embodiment examples in conjunction with the drawings.

DESCRIPTION OF THE PREFERRED EMBODIMENTS

Figure 1:
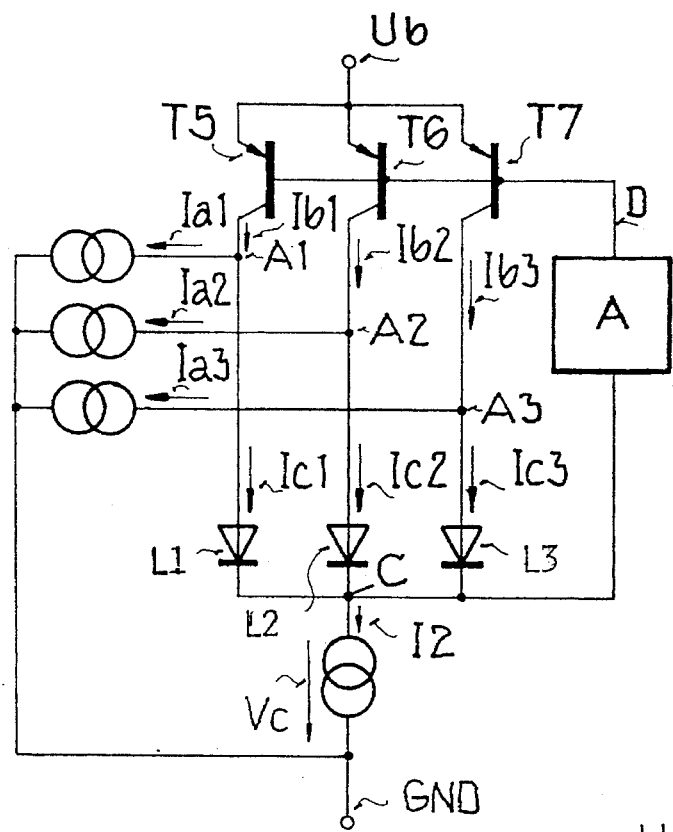
FIG. 1 is a circuit arrangement with three load elements whose frequency range includes a dc-parameter and which can also be used for balancing unsymmetrical signal sources.
Figure 4:
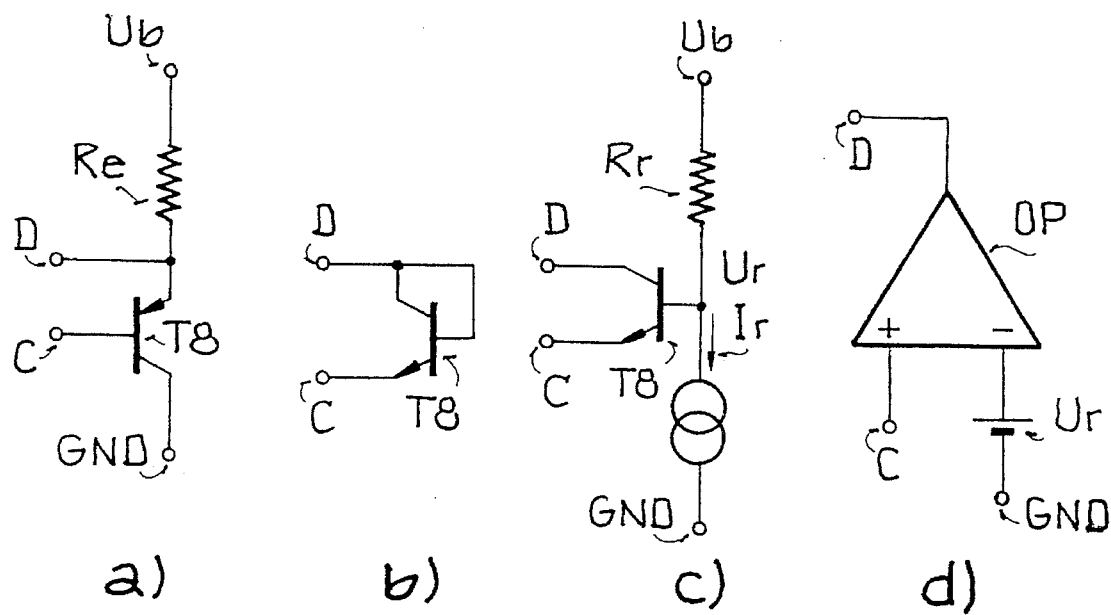
FIGS. 4a–4d show some examples for the embodiment of the controlling elements.

In FIG. 1, the current sources Ia1, Ia2, Ia3 represent the signal current sources that supply a quiescent current overlaid with a signal current in accordance with the present invention. The nodes A1, A2, A3 correspond to the load resistor terminals. In each case one load element L1, L2 or L3, which in general terms is to be understood to be a non-linear two-terminal element, is connected with its first terminal to a respective node A1, A2, A3. The second terminals of the load elements are connected together as node C. A supply current source I2 supplies the load elements with current (where I2 also indicates the value of the current). In the present case, the load elements L1, L2 and L3 are in the form of diodes. At the same time, a controlling element A is connected to the load elements, here specifically as node C, that establishes a link to the inputs D of controllable current sources T5, T6 and T7 that are in the form of pnp transistors and whose collectors are also connected to node A1, A2 and A3, respectively, while their emitters are at the potential of the operating voltage Ub. In the simplest case, the controlling element A simply has the task of providing suitable working potentials at nodes A1, A2 and A3 and can consist of a simple diode, zener diode or suchlike. For more sophisticated controls, it is also possible to use a transistor as shown in FIG. 4a) or a differential amplifier as shown in FIG. 4d).

The supply current I2 loads node C and tends to reduce its voltage Vc (towards ground GND). A reduction of Vc is passed on via controlling element A to the inputs D of the controlled current sources T5, T6, T7 whose currents Ib1, Ib2, Ib3 are then increased. This acts contrary to the assumed reduction so that a state of equilibrium is obtained. If it is assumed that controlling element A at node C requires virtually no current, then the supply current I2 flows exclusively into load elements L1, L2 and L3 and the equation I2=Ic1+Ic2+Ic3 applies. In the normal case, the controlled current sources T5, T6, T7 are identical to each other and therefore also Ib1=Ib2=Ib3=Ib. The current of signal sources Ia1, Ia2, Ia3 can be stated as the sum of average value plus a deviation Ia1=Ia+ia1, Ia2=Ia+ia2, Ia3=Ia+ia3. If one then also defines Ic=I2/3, then Ic1=Ic−ia1, Ic2=Ic−ia2, Ic3=Ic−ia3. This means that in the load elements the same current differences will apply as in the signal sources, but that the basic value is given only by the current Ic=I2/3. If one selects Ic<Ia, then the differences in relation to the basic value are greater. The rise in the relative differences can be used for amplification as will be shown in the further embodiment examples. Because the currents in the load elements do not depend on the basic value Ia of the signal currents Ia1, Ia2, Ia3, but only on their differences, the balancing effect of the arrangement results. An unsymmetry between two signal sources means that the change in one of these is not exactly opposite to the change in the second. In the case of three or more signal sources, unsymmetry can simply be understood to mean that the total of all changes is not equal to zero. In this sense, the arrangement has a balancing effect because the total of the current flowing through the load elements is always I2 and consequently the total of changes must be zero. The balancing effect applies for the currents flowing through the load elements. Because the controlling element A is designed as a high-amplification differential amplifier in accordance with FIG. 4d, the second input of which is connected with a reference voltage Ur, it is possible to ensure that the voltage at node C undergoes practically no further change. The voltages at the nodes A1, A2, A3 of the required symmetry suffice with respect to common-mode quantities.

Figure 3:
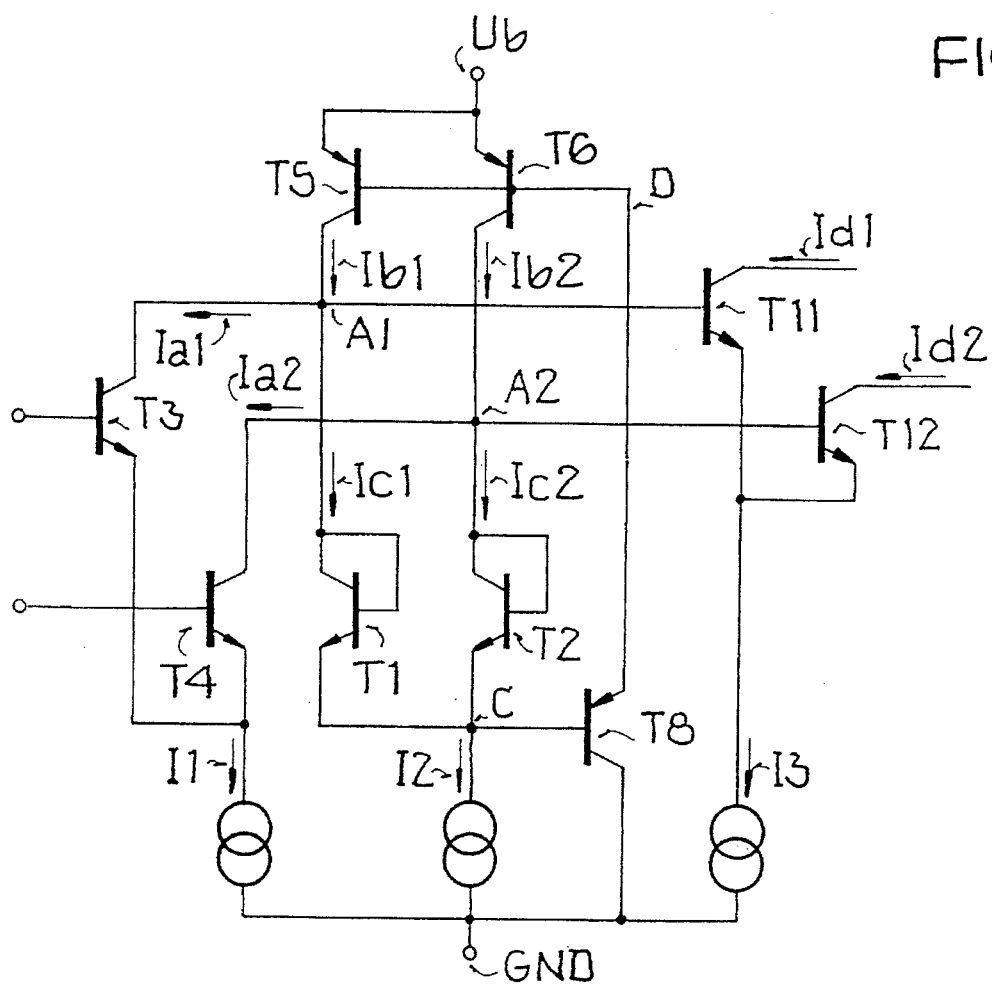
FIG. 3 shows the insertion of electronic load resistors between two differential stages.

FIG. 3 shows the use of electronic load resistors as the connecting link between two differential stages. The first differential stage comprises transistors T3 and T4 and the supply current source I1. They draw the output currents Ia1 and Ia2 from the terminals A1, A2 of the electronic load resistors. The second differential stage comprising the transistors T11 and T12 and the supply current source I3 is connected with its input to the terminals A1, A2. The load elements L1, L2 are respective transistor diodes T1, T2. The controlling element comprises transistor T8 which is connected as an emitter follower.

If the base currents are neglected, then, as in the description for FIG. 1, Ib1=Ia1+Ic1 and Ib2=Ia2+Ic2. Since the currents Ib1 and Ib2 are identical to each other and must be constant on account of Ib1+Ib2=I1+I2, any change in Ia1 or Ia2 results in a change in Ic1 and Ic2 respectively of equal magnitude but in the opposite sense. The smaller the current I2, the larger the differential resistance of transistor diodes T1, T2 and thus the voltage amplification between the input of the first differential stage to the output A1, A2. For technologically similar transistors, this results in a gain of V=I1/I2 if the base currents are neglected, and in the case of gains of up to about 10% of the current gain in the transistors used only slight deviations result.

Current I2 is required additionally, as opposed to a differential stage operating with ohmic resistors. The relationship V=I1/I2 shows that the additionally required current corresponds to a factor 1/V that, for gains commonly encountered, is of no great significance.

The logarithmic relationship between the forward voltage of a semiconductor diode and the current flowing through results in the voltage difference between A1 and A2 being distorted at greater modulation values. The exponential characteristic of the transistors T1, T12 in the second differential stage cancels out this distortion so that a linear relationship results between the input currents Ia1−Ia2 and the output currents Id1−Id2. The electronic load resistors thus compensate the non-linearity in the second differential stage. Consequently a greater modulation range is possible in electronic load resistors than in ohmic load resistors.

In the region of not too large currents semiconductor diodes display predominantly shot noise. At the same time, the noise power of a semiconductor diode in which current is flowing through in the forward direction and having the differential resistance Rx is just half as great as that of a corresponding ohmic resistor of magnitude Rx. Thus, the noise contribution of the semiconductor diodes in electronic load resistors is less than the contribution of corresponding ohmic load resistors. Although this advantage is covered by the noise of the controllable current sources T5, T6, it is found that their noise contribution is at the most of a similar magnitude as that of the first differential stage with T3, T4, and by inserting emitter resistors in front of the emitters of T5 and T6 it can be dropped further.

FIGS. 4a–4d represent several variants of the controlling element showing how it can be inserted between the connecting point C of the load elements and the input D of the controllable current sources. FIG. 4a) repeats the embodiments of FIG. 3 but adds a load resistor Re to the emitter follower, thus increasing the control rate.

In the partial drawing FIG. 4b) the controlling element consists simply of a diode. This form is sufficient for gains that are not too high as long as the current required for the bases of transistors T5 and T6 is small compared with current I2. For I1/I2>>1 (practically more than approximately 5) the base current of the controllable current sources is more significant and one then has approximately V=I1/(I2-Ir), where Ir is the base current of transistors T5 and T6. The circuit will function reliably only as long as I2>Ir.

In order to obtain a smallest possible supply voltage, the controlling element shown in FIG. 4c) is recommended. A reference voltage Ur, which is approximately 0.3 V below the supply voltage Ub, is fed to the base of transistor T8. This voltage can be generated in accordance with the diagram (also for several controlling elements) with the aid of a resistor Rr and a current source Ir. With this controlling element, a differential amplifier lo becomes operable with electronic load resistors and conventional transistor current sources from approximately Ub=1.2 V. With regard to the loading of node C by the input currents of the controlled current sources T5, T6 and the correction of the amplification formula, the same applies as already stated for the diode circuit under FIG. 4b).

Finally, FIG. 4d) shows a more general embodiment with a differential amplifier OP and a reference voltage Ur. With sufficiently large amplification of the differential amplifier OP, the voltage at node C becomes equal to the reference voltage Ur irrespective of the supply currents I1 and I2.

Figure 5:
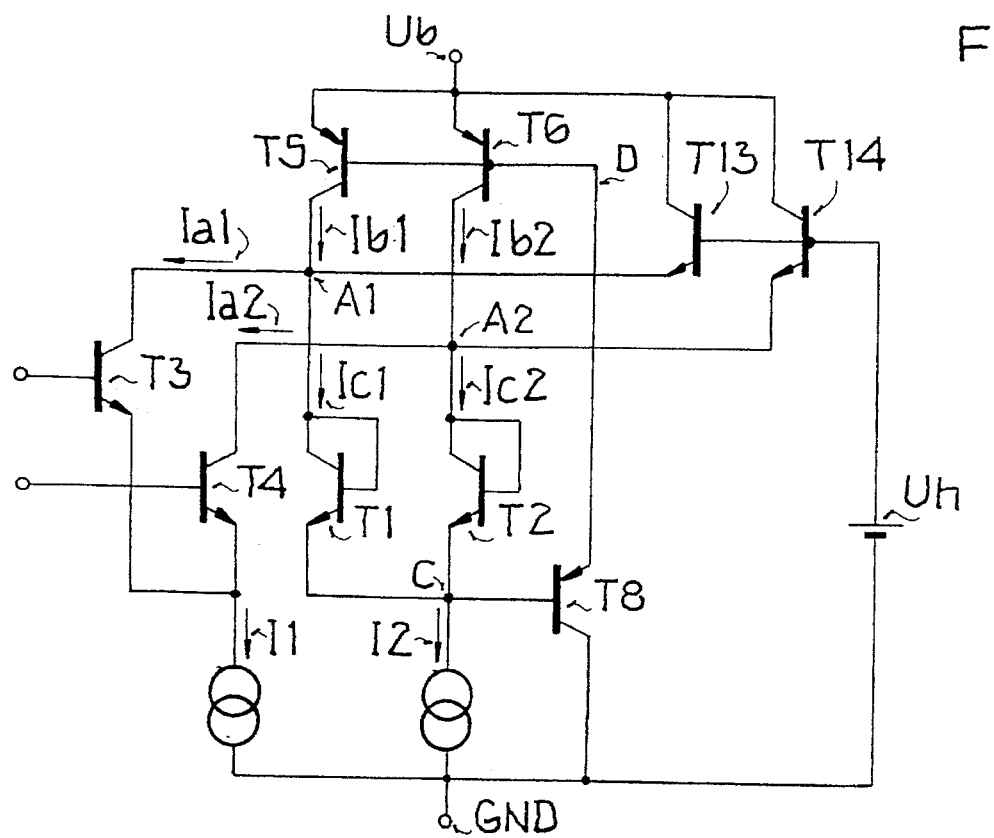
FIG. 5 shows an example for over load protection by limiting diodes or transistors.

If in a circuit according to FIG. 3 the difference of the currents |Ia1−Ia2|>I2, the modulation range of the electronic load resistors is exceeded. Assuming that Ia1>Ia2, then the transistor diode T1 has no current flowing through it and the voltage at A1 drops until the base-collector diode of T3 becomes conductive or another saturation effect occurs. In order to avoid this, limiting transistors T13, T14 are connected to terminals A1, A2 as shown in FIG. 5 in order to prevent the non-permitted drop of one of the voltages at A1 or A2. The bases of the limiting transistors T13, T14 are connected to an auxiliary voltage Uh depending on the selected working point, and the collectors to the supply voltage Ub. It is also possible for collectors and bases to be connected to the auxiliary voltage Uh or to the supply voltage Ub.

Figure 6:
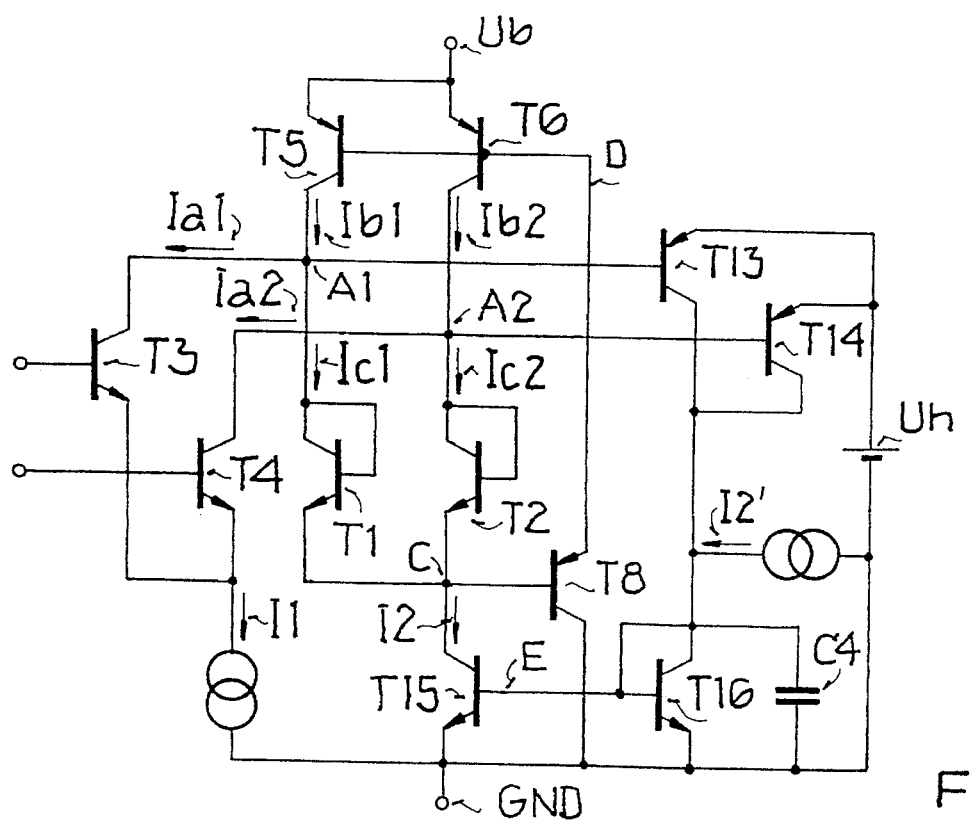
FIG. 6 shows an example for overload protection by automatic control of the electronic load resistors.

As can be seen from the relationship V=I1/I2, the gain V can be set by the ratio of the current. This leads to the possibility of adapting the gain to the signal and in this way preventing any overloading. FIG. 6 shows an embodiment example of this. Instead of the limiting transistors, the circuit includes a base-emitter diode for each monitoring transistor T13, T14. The collectors are connected to the base E of a current source transistor T15 which represents the supply current source I2. The working points of the monitoring transistors have been selected such that a significant current to input E occurs only at greater modulation values. This current amplifies or generates the current in transistor T15 which causes the gain to drop and overloading is prevented. Through a filter capacitor C4 between input E and ground GND, the gain control is provided with a generally desirable slow response. The gain control can be made less dependent on fluctuations in the current gain of transistor T15 by means of a transistor diode with transistor T16 connected in front of the input. The basic current I2 can be fixed to prevent overloading, as shown in the diagram, by means of an independent current source I2' which feeds the current source input E. It is also possible, however, to select the working point of the monitoring transistors T13, T14 in such a way that they conduct a current even in the quiescent state, as required in order to generate I2.

Figure 2:
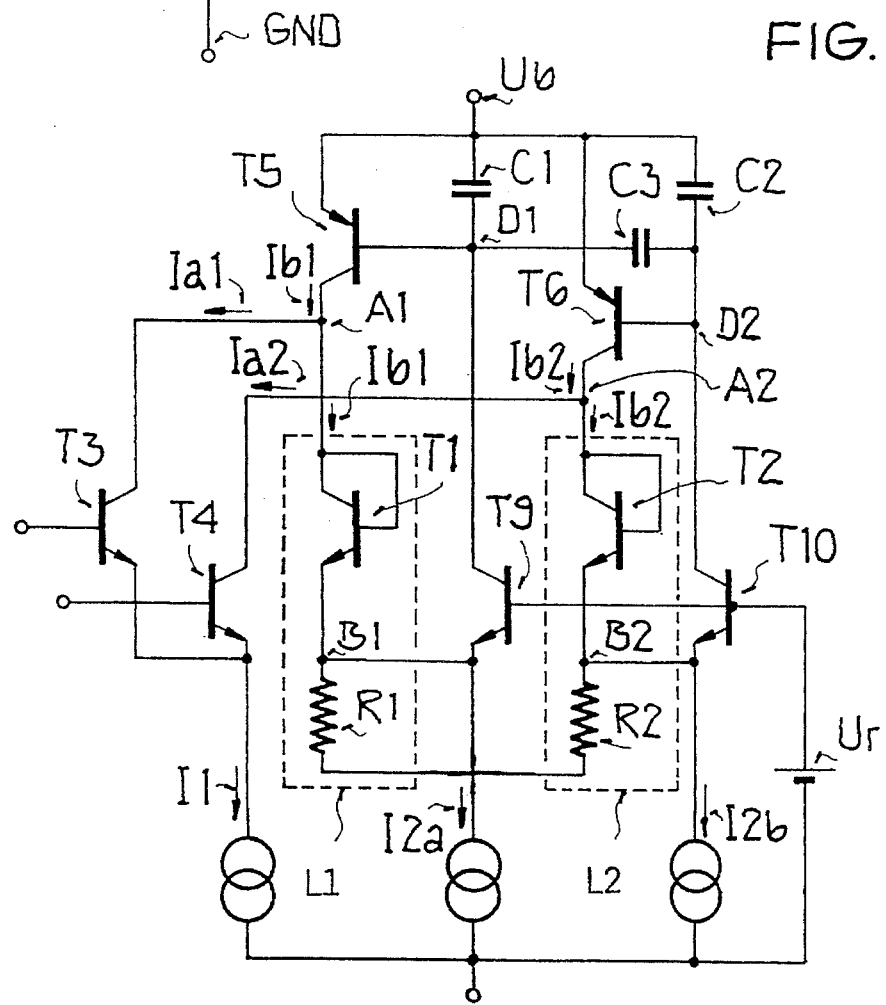
FIG. 2 is a circuit arrangement with two load elements for signals above a given limiting frequency that can balance statically unsymmetrical signals.

When electronic load resistors are used for periodic quantities, it is required to suppress drift effects and undesirable common-mode quantities. This is achieved in accordance with FIG. 2 in that the load elements L1, L2 are made up in each case of a series circuit with two circuit elements T1, R1 and T2, R2, respectively whose terminals are connected to a controlling element T9, T10 each, the output of the controlling elements being connected in each case to the input of the associated controlled current source T5, T6. A capacitor is connected to each input of a controlled current source against a supply terminal and/or against another input.

This circuit extension operates on the principle of separating common-mode and periodic quantities and feeding back the common-mode variables in negative feedback mode to the input terminals A1, A2. In order to obtain the common-mode quantities in suitable polarity, the load elements L1, L2 in the embodiment example are made up by the series circuit of a transistor diode T1 and T2 respectively and an ohmic resistor R1 and R2 respectively (in a BICMOS technology, the resistor R1 or R2 can, for example, also be a field-effect component). At the resistors R1, R2 which are assumed to be identical to each other, voltage drops occur in accordance with the current Ib1 and Ib2 flowing through the load elements. If these currents are not equal, a voltage difference occurs between the connecting points. The controlling elements, which in the embodiment example are the common-base transistors T9, T10, have unequal currents flowing through them as a result of this voltage difference. Unequal currents Ib1, Ib2 result from this, in accordance with the current gain of transistors T5, T6 of the controlled current sources. This inequality counteracts a static difference in the input currents Ia1, Ia2, the static difference between currents Ib1 and Ib2 in the load elements L1, L2 is reduced. For the intended function, it is normally sufficient for resistors R1, R2 to have a magnitude of 5 to 20% of the differential resistance of the transistor diodes T1, T2. Although the advantage of electronic load resistors compared with pure ohmic load resistors is adversely affected by this, it is not cancelled. The compensation of distortions in a following differential stage is also adversely affected but can be improved again by including suitably selected emitter resistors.

The capacitors connected at the inputs of the controlled sources ensure that this negative feedback disappears above a limiting frequency. Relatively small capacitances are sufficient at this point on account of the high impedances. The application of a capacitor C3 between two inputs should be preferred to two capacitors C1, C2 against Ub or GND because the same effect is achieved with $C3=(C1+C2)/4$ and because the frequency range of the balancing effect (i.e. the response to common-mode components of the input currents) is affected less. The capacitive circuit of the inputs of the controlled current sources also accomplishes the object of suppressing any negative effect of the collector-base capacitance (Miller effect) on the current source function of transistors T5, T6.

Figure 7:
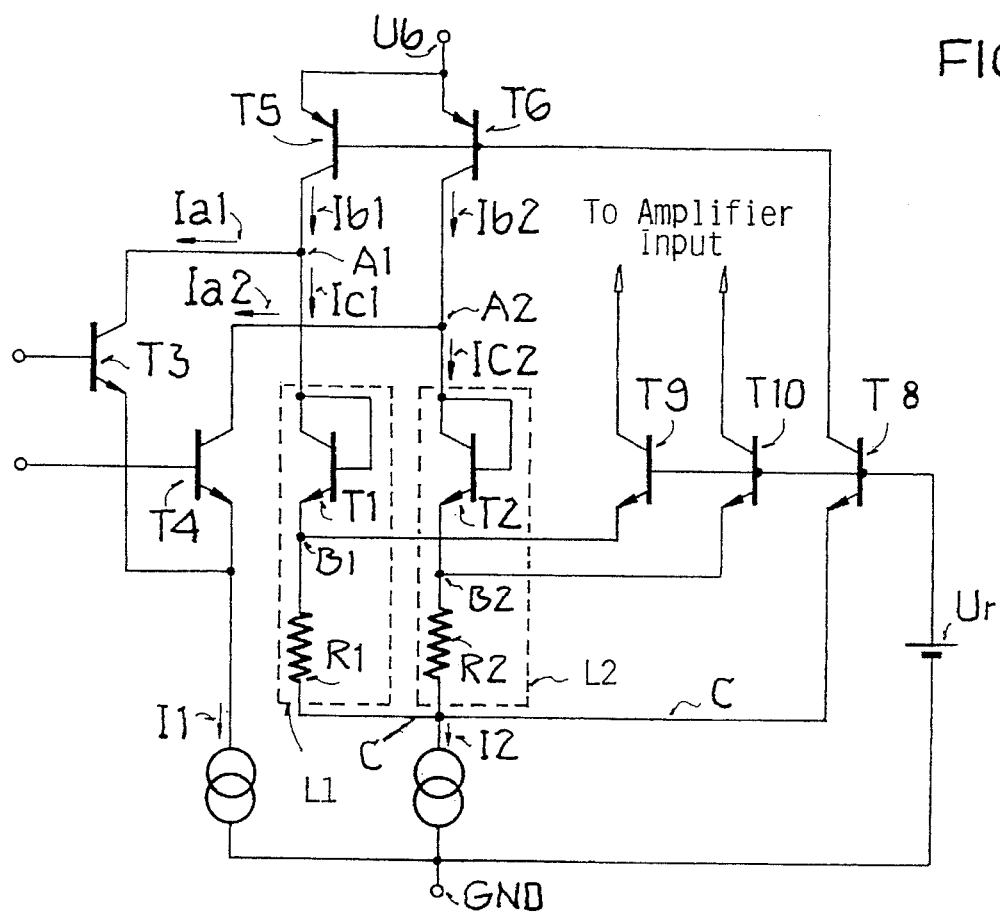
FIG. 7 is a circuit arrangement with additional controlling elements that can be used for working point stabilization on a preceding function unit.

In multiple stage a.c. voltage amplifiers, it is usual to design the working point stabilization as a frequency-limited negative feedback. A suitable output signal can be generated with the embodiment example shown in FIG. 7. The circuit includes an internal working point stabilization function with the control transistor T8 which is connected at connection point C of the load elements L1, L2 and which controls the transistor current sources T5, T6 on the collector side. The load elements themselves are designed in the form of a series circuit made up of transistor diode T1 and T2 respectively and resistor R1 and R2 respectively. Further controlling elements T9, T10 are connected to the connection points of these series circuits and the output signal of these elements has been designed to provide feedback to the amplifier input. Considered in more detail, this type of feedback includes limitation of the transmitted frequency band and is effected in other respects with known circuitry means.

Figure 8:
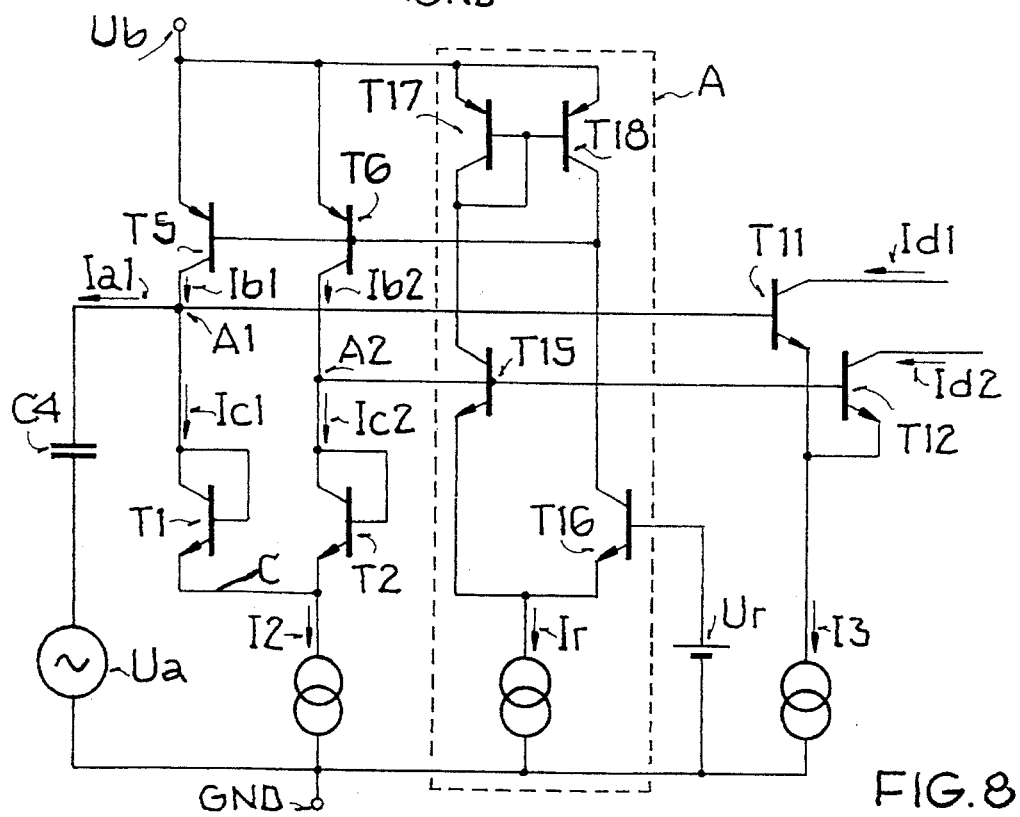
FIG. 8 shows the use of electronic load resistors for bias supply in a differential stage with generation of a well-defined input resistance.

Finally, FIG. 8 shows an example of how electronic load resistors can be used for the bias supply of a differential stage and generation of a well-defined input resistance. The differential stage T1, T12, I3 is connected on the input side to the terminals A1, A2 of the electronic load resistors.

The controlling element A is designed as a differential amplifier with transistors T15 to T18 and current source Ir. The inputs are connected to terminal A2 of the electronic load resistor and a reference voltage Ur. A signal source Ua (it can also be a source with the nature of a current source) is, possibly via a coupling capacitor C4, connected to the terminal A1 of the electronic load resistor and an input of the differential stage T11, T12.

The control amplifier A is a high-gain differential amplifier adapted to achieve the object. Its input voltage Ua2-Ur, where Ua1, Ua2 signify the voltage at terminals A1 and A2 respectively is therefore small by comparison with the other signal voltages. Ideally, terminal A2 is kept at reference voltage Ur. An input voltage Ua is transmitted via C4 to terminal A1 so that the voltage difference will be Ua1−Ua2= Ua. The input voltage is thus applied to the series circuit of transistor diodes T1, T2. Their differential resistance results from the temperature voltage Ut=25 mV (at room temperature), known from semiconductor physics, and the current I2/2 flowing through in each case, and thus becomes 4 Ut/I2. The input resistance therefore depends, apart from the temperature, only on current I2 and can therefore be set by I2. The input resistance of the differential stage T11/T12 is connected in parallel to the electronically generated resistance 4Ut/I2 and must possibly be taken into account. The bias currents of the differential stage are also supplied from the controlled current sources T5, T6 through the controlling mechanism.

If the first input of controlling element A is placed at connection point C instead of at terminal A2, the voltage at C is fixed to the reference voltage Ur. The electronic input resistance of 2Ut/I2 then results and the voltage at terminal A2 varies in the push-pull mode with the voltage supplied at A1. The electronic load resistors assume here the balancing function already described.

The embodiment examples shown in FIGS. 1 to 8 can also be made up from transistors of the opposite type, i.e. instead of npn-transistors also pnp-transistors and vice-versa. Furthermore, instead of bipolar transistors, field-effect transistors can also be used.

What is claimed is:

1. An electronic load resistor circuit fed from at least one signal source comprising:
   at least two load elements each representing a non-linear two-pole element and including either a semiconductor diode or a transistor diode, with a first terminal of each of the load elements being connected to a respective controllable current source and with respective second terminals of the load elements being connected together;
   at least one supply current source for supplying current to the load elements; and
   a controlling element connected to the load elements for controlling the respective controllable current sources.

2. An electronic load resistor circuit in accordance with claim 1, wherein each load element comprises a series circuit of the respective diode and a further circuit element.

3. An electronic load resistor circuit, fed from at least one signal source, comprising:
   at least two load elements each of which represents a non-linear two-pole element and each of which consists of a series circuit of two circuit elements, with one of the circuit elements being either a semiconductor diode or a transistor diode, with a first terminal of each of the load elements being connected with a respective controllable current source, and with respective second terminals of the load elements being connected together;
   a supply current source for supplying current to the connection point of the second terminals of the load elements or alternatively for supplying current to respective connection points of the two circuit elements of the load elements;
   means connecting each respective connection point of the two circuit elements of a load element with an input of the respective controllable current source via a respective controlling element; and
   respective capacitors connected between each control input of each of the controllable current sources and a circuit reference point, and another capacitor connected between respective control inputs of the controllable sources.

4. An electronic load resistor circuit in accordance with claim 3, wherein the other circuit element is an ohmic resistor.

5. An electronic load resistor circuit in accordance with claim 4, wherein the supply current source supplies current to the connection point of the second terminals of the load elements.

6. An electronic load resistor circuit in accordance with claim 4, wherein the supply current source includes respective current sources for supplying current to the respective connection points of the circuit elements.

7. An electronic load resistor circuit in accordance with claim 1, wherein the controlling element is connected to the connection point of the second terminals of the load elements.

8. An electronic load resistor circuit in accordance with claim 6, wherein each controlling element comprises a diode.

9. An electronic load resistor circuit in accordance with claim 5, wherein each controlling element comprises a differential amplifier having a first input connected to a respective connection point of the two circuit elements of a load element, a second input to which a reference voltage is supplied, and an output connected to said input of the respective controllable current source.

10. An electronic load resistor circuit in accordance with claim 5, wherein each controlling element comprises a bipolar transistor whose emitter terminal is used as a control input, whose base terminal is used as a reference input and whose collector terminal is used as an output.

11. An electronic load resistor circuit in accordance with claim 8, wherein the respective controllable current sources are transistor current sources.

12. An electronic load resistor circuit in accordance with claim 11, wherein the respective supply current sources are transistor current sources that can be controlled at the base.

13. An electronic load resistor circuit in accordance with claim 12, wherein the first terminal of a load element is connected to a voltage limiting transistor.

14. An electronic load resistor circuit in accordance with claim 13, wherein a second terminal of the limiting transistor is connected to a supply voltage.

15. An electronic load resistor circuit in accordance with claim 13, wherein a second terminal of the limiting transistor is connected to a reference voltage.

16. An electronic load resistor circuit in accordance with claim 6, wherein the first terminal of a load element is connected to one terminal of a limiting diode formed by the emitter-base junction of a bipolar transistor and the collector of this transistor controls the supply current source.

17. An electronic load resistor circuit in accordance with claim 16, wherein a transistor diode is connected in parallel with a control input of the supply current source.

18. An electronic load resistor circuit in accordance with claim 16, wherein a capacitor is connected in parallel with a control input of the supply current source.

* * * * *